United States Patent [19]
Majidi-Ahy et al.

[11] Patent Number: 5,594,341
[45] Date of Patent: Jan. 14, 1997

[54] NUCLEAR MAGNETIC RESONANCE RECEIVER, METHOD AND SYSTEM

[75] Inventors: Reza Majidi-Ahy, Los Altos; Howard Hill, Cupertino, both of Calif.

[73] Assignee: Varian Associates, Inc., Palo Alto, Calif.

[21] Appl. No.: 266,076

[22] Filed: Jun. 27, 1994

[51] Int. Cl.⁶ ............................ G01V 3/00; G01V 3/14
[52] U.S. Cl. ................................... 324/322; 324/318
[58] Field of Search ............................. 324/300, 301, 324/303, 318, 322, 307, 309

[56] References Cited

U.S. PATENT DOCUMENTS

| | | | |
|---|---|---|---|
| 4,866,260 | 9/1989 | Lescourret et al. | 324/78 |
| 4,873,486 | 10/1989 | Kuhn et al. | 324/307 |
| 4,879,514 | 11/1989 | Mehlkopf et al. | 324/309 |
| 4,949,040 | 8/1990 | Proska et al. | 324/307 |
| 4,992,736 | 2/1991 | Stormont et al. | 324/309 |

*Primary Examiner*—Sandra L. O'Shea
*Assistant Examiner*—Mack Haynes
*Attorney, Agent, or Firm*—Edward Berkowitz

[57] ABSTRACT

An NMR receiver includes an analog to digital converter for sampling a nuclear magnetic resonance probe output signal at a frequency that is less than the probe signal center frequency and is at least twice the probe signal bandwidth.

34 Claims, 5 Drawing Sheets

NUCLEAR MAGNETIC RESONANCE RECEIVER, METHOD AND SYSTEM

FIELD OF INVENTION

The present invention relates generally to nuclear magnetic resonance devices and methods and more particularly to such a device and method including an analog to digital converter for sampling a nuclear magnetic resonance probe output signal at a frequency that is less than the probe signal center frequency and is at least twice the probe signal bandwidth.

BACKGROUND ART

A typical nuclear magnetic resonance (NMR) facility, as illustrated in FIG. 1, includes probe 10 containing an analyte, i.e., sample, usually a chemical to be spectrally analyzed or tissue to be imaged. The analyte in probe 10 is subjected to a high intensity DC magnetic field, from a suitable source, and is excited by RF from transmitter 12. Probe 10 includes output coil 14 for supplying an analog signal to receiver 16. The analog signal typically has a center frequency between approximately 100 MHz–1 GHz and normally has a bandwidth where information about the analyte is contained of less than 5 MHz. Receiver 16 responds to the signal from probe 10 and excitation from transmitter 12 to derive digital signals representing "in phase" (I) and "quadrature phase" (Q) components representing the information in the signal derived from coil 14. Digital computer 18 responds to the I and Q representing signals derived by receiver 16 to drive output device 20, such as displays for amplitude versus frequency plots of the chemical sample spectrum or images of the samples.

Receiver 16 includes analog mixer 22, having a first input responsive to the output of probe 10 and a second input responsive to a constant frequency sine wave output of local oscillator 24, in turn synchronized by an output of transmitter 12. Mixer 22 derives an intermediate frequency (i.f.) that is passed by low pass filter 26, to the exclusion of other frequencies derived by the mixer. Low pass filter 26 is included in a suitable amplifier, not shown; in general, amplifiers of a type well known to those skilled in the art are not shown in FIG. 1 or the remaining figures of this document.

The i.f. output of low pass filter 26 is applied in parallel to I and Q processing channels 28 and 30. I and Q channels 28 and 30 are driven by a constant frequency sine wave output of local oscillator 32, synchronized by an output of transmitter 12. Local oscillator 32 drives analog mixers 34 and 36 of I channels 28 and 30, respectively, with mixer 36 being driven by the output of 90° phase shifter 37. Mixers 34 and 36 respond to the inputs thereof to derive orthogonally phased I and Q channel signals including the information in the signal derived from coil 14 of probe 10. The output signals of mixers 34 and 36 are respectively applied to low pass filters 38 and 40, which pass the baseband frequencies and eliminate other output frequencies derived by the mixers to derive orthogonally phased I and Q channel baseband signals.

The I and Q baseband output signals of low pass filters 38 and 40 are respectively applied to analog to digital converters 42 and 44. Analog to digital converters 42 and 44 sample the baseband signals supplied to them by low pass filters 38 and 40 at a frequency controlled and synchronized by a reference time base or master clock also controlling transmitter 12. Each time converters 42 and 44 are supplied with a sampling pulse, the converters derive multi-bit outputs representing the amplitude of the signals supplied to them. To obtain the resolution necessary for accurate spectral analysis and/or imaging purposes, the output signals of converters 42 and 44 preferably include 12 to 18 parallel output bits, supplied to a 12–18 bit bus. The digital signals on the output buses of converters 42 and 44 are respectively supplied to digital computer 18.

A problem with receiver 16 of FIG. 1 is the use of analog components, such as mixers 34 and 36, low pass filters 46 and 48 and the amplifiers as well as the analog to digital converters associated therewith. These analog components must be closely matched to enable signals having the required accuracy to be supplied to analog to digital converters 42 and 44. In addition, as the components are subjected to different temperatures and age, there is a tendency for the analog components to derive signals that drift relative to each other. This causes inaccuracies in the relative values of the I and Q channel digital signals supplied to computer 18 and to output device 20.

It is, accordingly, an object of the invention to provide a new and improved nuclear magnetic resonance system, method and receiver having relatively low cost and great accuracy.

Another object of the invention is to provide a new and improved nuclear magnetic resonance system and method with an accurate, high resolution receiver that is relatively inexpensive and employs virtually all digital components.

Still another object of the present invention is to provide a new and improved nuclear magnetic resonance receiver for deriving in phase and quadrature phase channel signals by utilizing a single relatively inexpensive analog to digital converter for deriving a digital signal having high resolution, sufficient to provide accurate spectral and image data.

THE INVENTION

In accordance with the invention, there are provided an improved nuclear magnetic resonance system, an improved NMR receiver, and an improved method of processing an analog signal derived in response to an output of a nuclear magnetic resonance detecting probe. The signal has a center frequency and a bandwidth (B) that is a small fraction of the center frequency. Information about an analyte in the probe is contained in the bandwidth of the signal. The system, receiver and method include sampling the analog signal at a frequency substantially less than the center frequency and at least twice the bandwidth. An analog to digital converter means derives a digital signal having values commensurate with the amplitude of the analog signal samples. The digital signal resulting from the sampling is processed to derive another digital signal having a value determined by the information.

In one embodiment, the processing is performed by first and second digital multipliers driven in parallel by the digital signal derived by the converter and by digital representations of quadrature phased outputs of a local oscillator and sampling is at 2B. In a second embodiment, quadrature phased signals are derived by a Hilbert transformer or other means and sampling is at 4B since alternate outputs of the converter are applied to I and Q channels of the transformer. Low pass digital filter means, preferably including a decimating digital filter, responds to the quadrature phased digital signals derived by the digital multipliers. In a third embodiment, the converter is sampled by two waves having the same frequency and differing phases relative to a sinusoidal wave derived by the filter at the center frequency; the differing sampling waves are preferably orthogonal relative to the sinusoidal wave phase and include sampling pulses during different cycles of the sinusoidal wave.

In one arrangement, the analog signal sampled by the converter has the same center frequency as the center frequency derived from a detecting coil of the probe. In a second arrangement the analog signal sampled by the converter is at an intermediate frequency between the center frequency derived from the probe detecting coil and baseband.

The above and still further objects, features and advantages of the present invention will become apparent upon consideration of the following detailed descriptions of several specific embodiments thereof, especially when taken in conjunction with the accompanying drawings.

DESCRIPTION OF THE PREFERRED EMBODIMENTS

Figure 1:
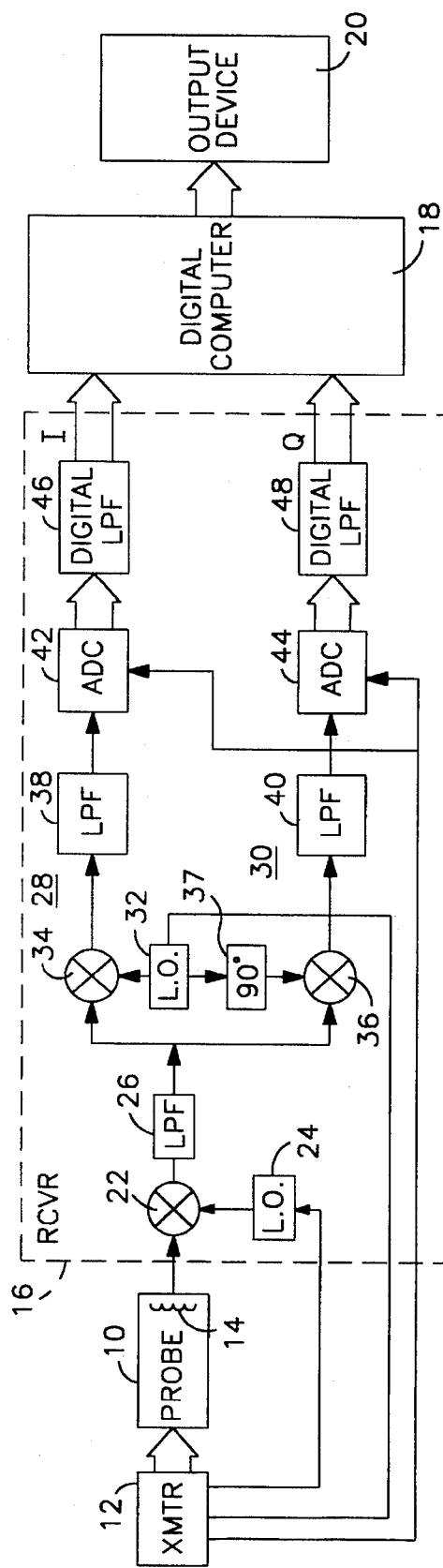
FIG. 1, as described supra, is a block diagram of a prior art nuclear magnetic resonance system.
Figure 2:
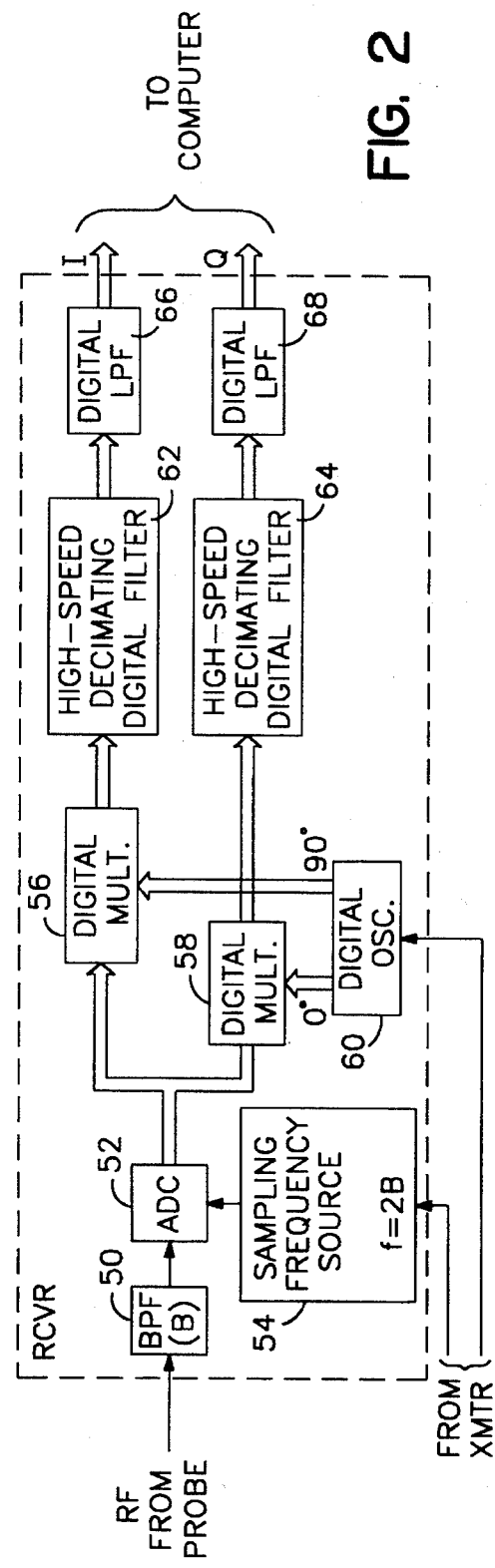
FIG. 2 is a block diagram of a first embodiment of a receiver utilized in the system of FIG. 1, instead of the receiver illustrated therein.

Reference is now made to FIG. 2 of the drawing, a block diagram of a receiver employed in accordance with one embodiment of the present invention, instead of receiver 16 of FIG. 1. The receiver of FIG. 2 includes bandpass filter 50 connected directly or via a suitable RF amplifier, to output coil 14 of probe 10. Bandpass filter 50 has a center frequency equal to or greater than the center frequency of the signal derived from coil 14 and a bandpass, B, equal to the bandwidth of the signal resulting from r.f. excitation of the analyte in probe 10 by transmitter 12. Typically, the bandwidth of the output signal of coil 14 of probe 10 is about 2 percent of the center frequency of the coil output signal; e.g. the center frequency is 600 MHz, the bandpass of filter 50 is 12.5 MHz and the bandwidth of the output signal of coil 14 is less than 5 MHz. The output signal of bandpass filter 50 is coupled to an analog signal input terminal of analog to digital converter 52, having a sample input terminal responsive to sampling pulses from local oscillator 54. The pulses derived from oscillator 54 have a frequency considerably less than the center frequency of the output of coil 14 of probe 10 and at least 2B; preferably the sampling frequency is 2B. Local oscillator 54 is synchronized by a reference time base or master clock (not shown) also controlling transmitter 12.

Converter 52 responds to the waveforms at signal and sample input terminals thereof to derive a digital signal having 12 to 18 parallel bits representing the amplitude of the signal at its signal input terminal each time a sample pulse is derived by local oscillator 54.

The high resolution, multi-bit output of converter 52 is applied in parallel to digital multipliers 56 and 58. Digital multipliers 56 and 58 are driven by orthogonally phased digital signals derived from digital oscillator 60, synchronized by the reference time base or master clock also controlling transmitter 12. The digital signal derived by oscillator 60 has a frequency given by $f_{lo}=f_{signal}-Nf_{sampling}$. Digital oscillator 60 derives two digital signals representing the amplitude, in digital form, of two sine waves that are 90° phase displaced from each other, and are derived at discrete, usually evenly displaced phases. The two output signals of digital oscillator 60 are multi-bit signals having, for example, 16 to 20 bits each.

Each of digital multipliers 56 and 58 responds to the two digital signals supplied to it to derive digital signals respectively supplied to high-speed decimating digital filters 62 and 64. Each of the signals supplied by multipliers 56 and 58 to filters 62 and 64 has approximately 12–18 bits and represents the in phase (I) and quadrature phase (Q) components of the information in the NMR signal derived from the probe; thus, the outputs of digital multipliers 56 and 58 are high resolution digital signals including the baseband levels and other frequency components of the in phase (I) and quadrature phase (Q) components of the information contained in the output signal of coil 14.

Each of decimating filters 62 and 64 combines multiple sequential multi-bit inputs supplied to it to derive a single multi-bit digital output signal. For example, filters 62 and 64 respectively accumulate the values of 16 successive digital signals representing the outputs of digital multipliers 56 and 58 to derive a single multi-bit signal representing these 16 accumulated values. Hence, each of decimating filters 62 and 64 is, in essence, a type of low pass filter, as well known to those skilled in the art. The output signals of decimating digital filters 62 and 64 are respectively applied to conventional digital low pass filters 66 and 68. Filters 66 and 68 respectively respond to each output of filters 62 and 64 to derive a single multi-bit digital signal. Digital filters 66 and 68 supply multi-bit signals, typically having between 18 and 24 parallel bits, representing the I and Q channel information of the signal derived from coil 14 of probe 10, to digital computer 18.

Because digital components are used exclusively in the I and Q channels of the receiver of FIG. 2, the I and Q channel values derived from the receiver of FIG. 2 are considerably more accurate than the I and Q channel signals derived from the receiver of FIG. 1 using analog components in the I and Q channels. The output signals of the receiver of FIG. 2 are not subject to change as a function of age and/or temperature, as in the analog signal processing receiver of FIG. 1. While it is necessary for the components in the I and Q channels of the receiver of FIGS. 1 and 2 to be matched, the digital components in FIG. 2 receiver are matched much more precisely with much less expense than the analog counterparts thereof of FIG. 1. The receiver of FIG. 2 can employ a high-speed sample-and-hold to accurately sample the signal,but a relatively inexpensive analog to digital converter having the required resolution because sampling is at a multiple of the bandwidth of the output signal of coil 14 of probe 10, instead of at a multiple of the center frequency of the probe output. Hence, output device 20 provides the necessary resolution for the spectral content of the analyzed chemical compound or for a nuclear magnetic resonance imaging system.

Operation of the receiver illustrated in FIG. 2 can be better understood from the plots of FIG. 3. Each of FIGS. 3a–3e is a plot of frequency versus amplitude at various terminals in FIG. 2. $F_s$ in each of FIGS. 3a–3e represents twice the bandpass of bandpass filter 50. The center frequency of the signal derived from filter 50 is assumed to be between $NF_s$ and $(N+1/2)F_s$. In one exemplary situation, the center frequency $(N+1/4)F_s$ is 612.5 MHz, filter 50 has a 12.5 MHz bandpass and sampling is at a frequency $F_s=25$ MHz. The low pass filter formed by decimating filter 62 and filter 66 or by decimating filter 64 and filter 68 has a cutoff frequency of $F_s/2$, as illustrated in FIG. 3e.

Figure 3A:
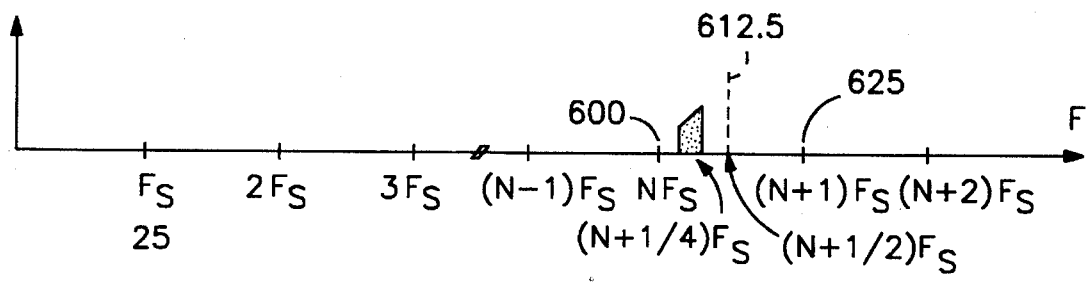
FIG. 3 is a series of plots useful in describing the operation of the apparatus illustrated in FIG. 2.
Figure 3B:
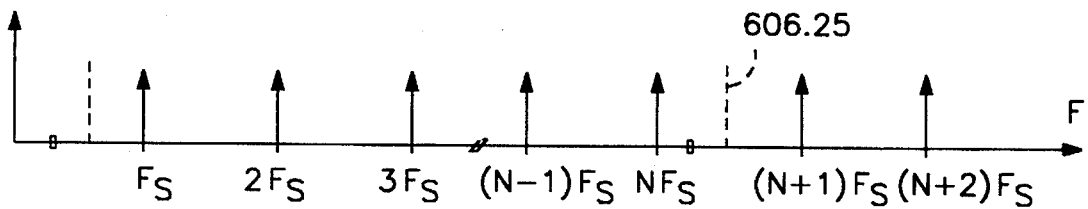
Figure 3C:
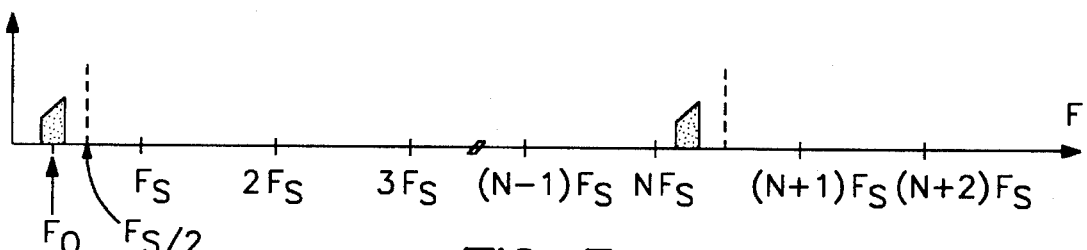
Figure 3D:
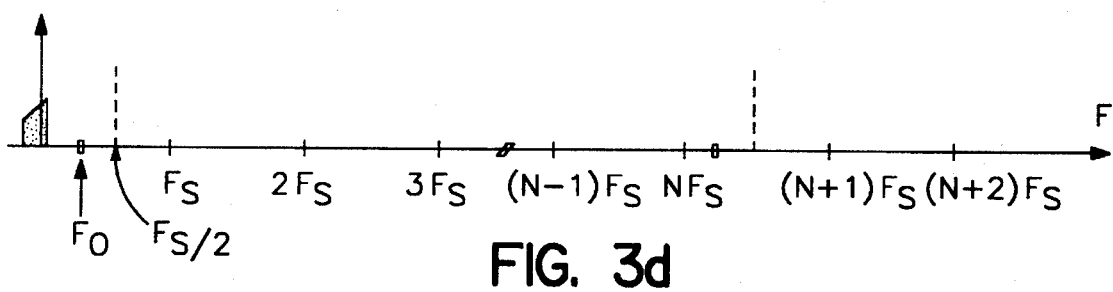
Figure 3E:
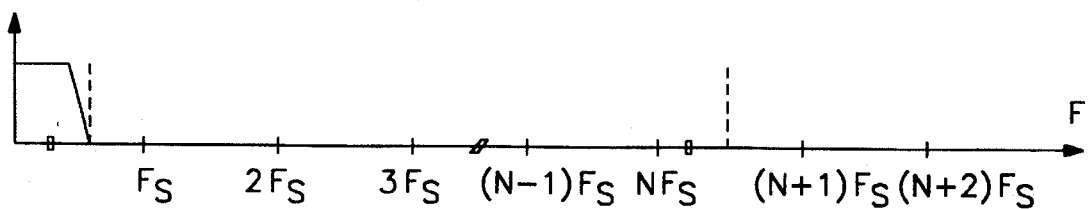

The sampling output of local oscillator 54 is represented in FIG. 3b as including very short duration pulses representing a combination of frequencies $F_s$, $2F_s$, $3F_s$ . . . $(N-1)F_s$, $NF_s$, $(N+1)F_s$, $(N+2)F_s$ . . . The signal derived from analog to digital converter 52 is similar to an i.f. signal and is represented in FIG. 3c by spectra located between F=0 and $F_s/2$ and between $NF_s$ and $(N+1/2)$ $F_s$. The spectra in FIG. 3c are centered on $F_0$ and $NF_s+F_o$, where $F_0=(1/4)$ $F_s$. The spectrum derived by converter 52 is translated to baseband by each of digital multipliers 56 and 58, and the filters associated therewith, so the spectra derived by filters 66 and 68 are represented in FIG. 3d, as including frequencies from 0 to the cut-off frequency of the filter.

Figure 4:
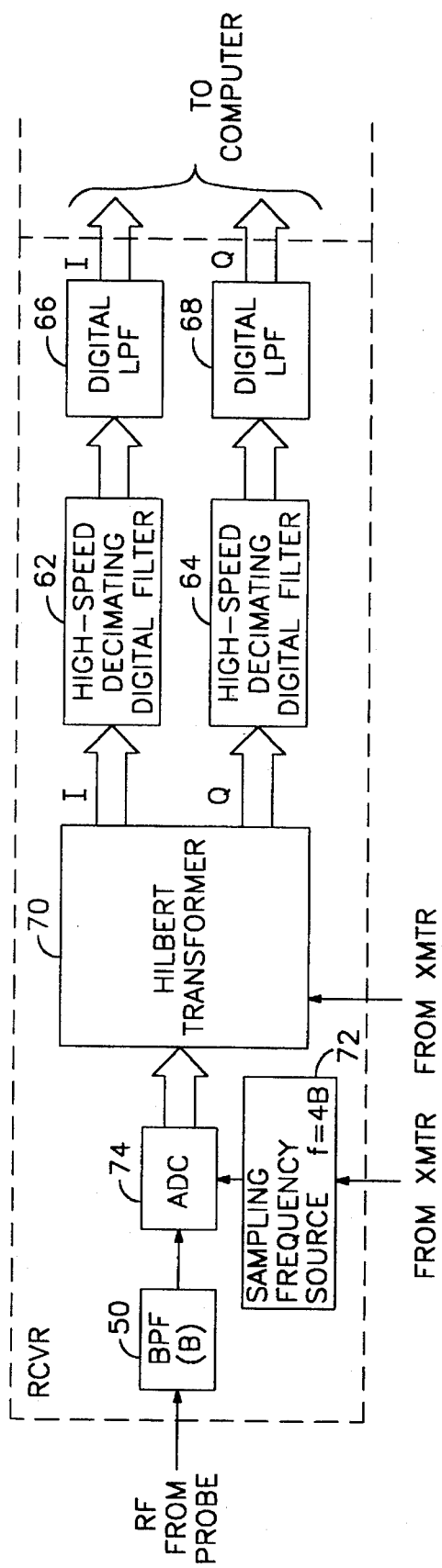
FIG. 4 is a block diagram of a second embodiment of a receiver using a Hilbert transformer in accordance with the present invention.

Reference is now made to FIG. 4 of the drawing, a block diagram of a second embodiment of the invention. The receiver of FIG. 4 is identical to the receiver of FIG. 2, except that digital multipliers 56 and 58 and digital oscillator 60 of FIG. 2 are replaced by Hilbert transformer 70 and the analog input signal of analog to digital converter 74, which derives a high resolution (e.g. 12–18 bits) parallel output signal, is sampled at a minimum frequency of four times the bandwidth (B) of filter 50, i.e. minimum sampling frequency =4B. The sampling frequency is chosen in relation to the bandpass spectrum such that all of the information in the passed bandwidth falls on one side of a harmonic of the sampling frequency, i.e. between NFs and (N+½)Fs. Then there is a Hilbert transform relation between the real and imaginary parts of the time domain signal, since the negative half of the spectrum is zero. Thus there is no need to complex sample the bandpass signal; the imaginary part of the sequence can be computed from the real part. Sampling times of the analog input signal to converter 74 is at a fixed rate controlled by sampling source 72 in turn responsive to a control signal from the transmitter. Hilbert transformer 70 is constructed in a manner similar to that disclosed in Chapter 10 of *Discrete-Time Signal Processing*, Oppenheim et al., Prentice-Hall, 1989, pages 662–694, with the addition of a 90° phase shifter component required for undersampling. Transformer 70 includes a time division multiplexer (not shown) for sampling alternate outputs of converter 74 and for processing them into I and Q parallel multi-bit outputs of the transformer. Hence, the I output of transformer 70 responds to the k, (k+2), (k+4) etc. outputs of converter 74 while the Q output of the transformer responds to the (k+1), (k+3), (k+5) etc. outputs of converter 74.

Transformer 70 is synchronized with the operation of converter 74 in response to an output signal of transmitter 12. Thereby, Hilbert transformer 70 derives I and Q signals representing the same information as is derived from the outputs of digital multipliers 56 and 58. The I and Q outputs of Hilbert transformer 70 are processed by low pass filter arrangements including decimating filters 62 and 64, as well as digital low pass filters 66 and 68, to supply digital computer 18 with high resolution I and Q multi-bit parallel digital signals.

The operation of the apparatus illustrated in FIG. 4 is more clearly understood by considering the amplitude vs. frequency plots of FIG. 5, which are similar to those of FIG. 3. The plot of FIG. 5a represents the amplitude of the output of bandpass filter 50, FIG. 4, while the plot of FIG. 5b represents the amplitude of samples derived from converter 74. The output of converter 74 is represented in FIG. 5c as including a baseband component, as well as components that are replicas of the spectrum between $NF_s$ and $(N+1)$ $F_s$. The spectra in FIG. 5c have center frequencies of $F_s$ . . . $NF_s$, $(N+1)$ $F_s$ . . . The spectra derived from converter 74, FIG. 4, are supplied to Hilbert transformer 70 and the filters driven thereby, which together have an amplitude versus frequency characteristic as illustrated in FIG. 5d. The output of converter 74 is processed by Hilbert transformer 70 and the filters responsive thereto to derive I and Q spectra, as illustrated in FIG. 5e. The spectrum illustrated in FIG. 5e is at baseband, being centered at $F_s=0$, and has a bandwidth equal to the bandwidth of the output signal of bandpass filter 50, FIG. 4, with the bandwidth determined by the sampling frequencies by converter 74 of the output of filter 50.

Figure 6:
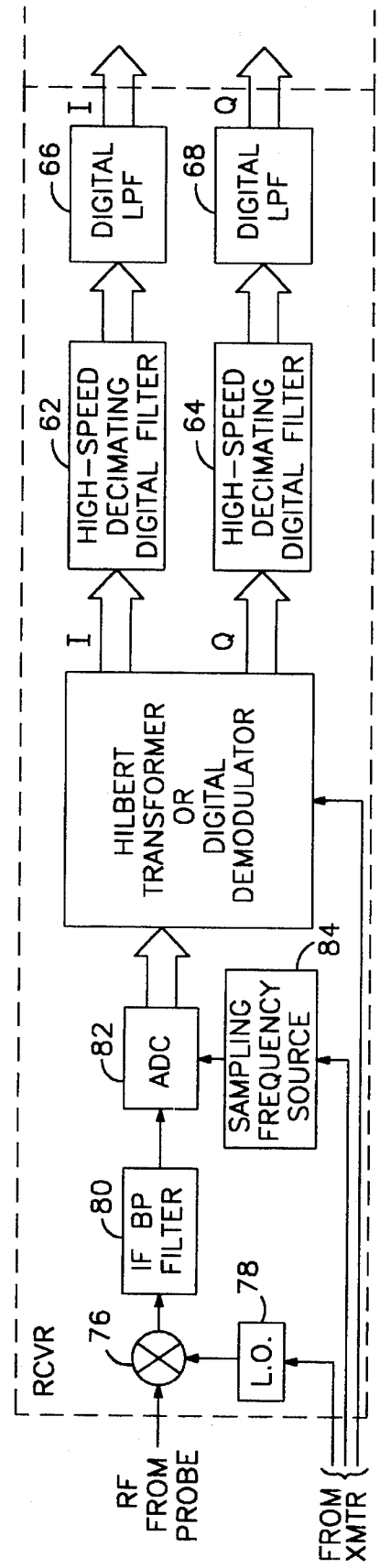
FIG. 6 is a block diagram of a third embodiment of a receiver including a local oscillator in accordance with the present invention.
Figure 5A:
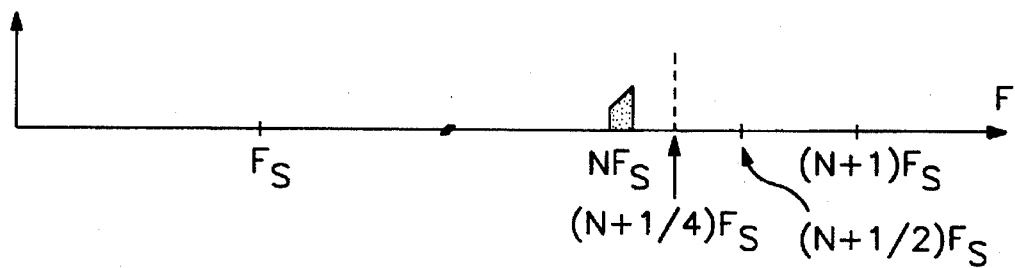
FIG. 5 is a series of plots useful in describing the operation of the apparatus illustrated in FIG. 4.
Figure 5B:
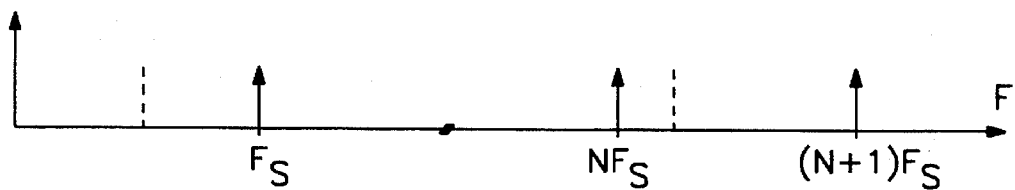
Figure 5C:
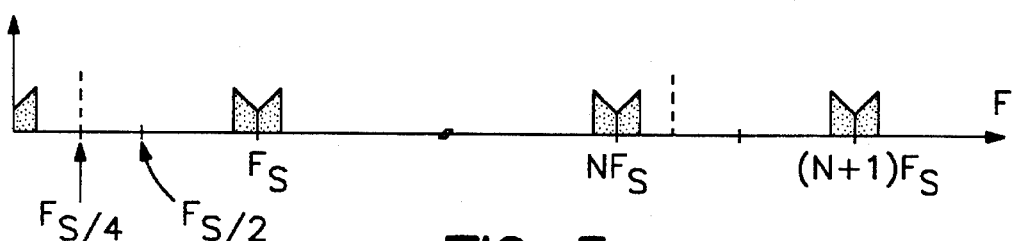
Figure 5D:
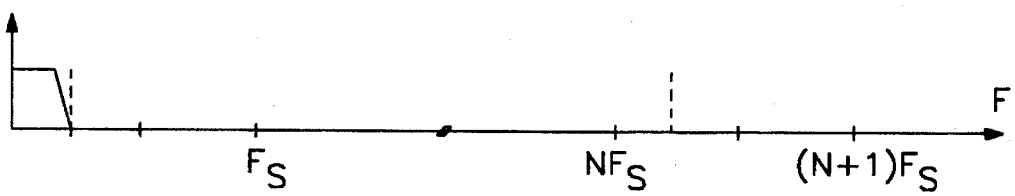
Figure 5E:
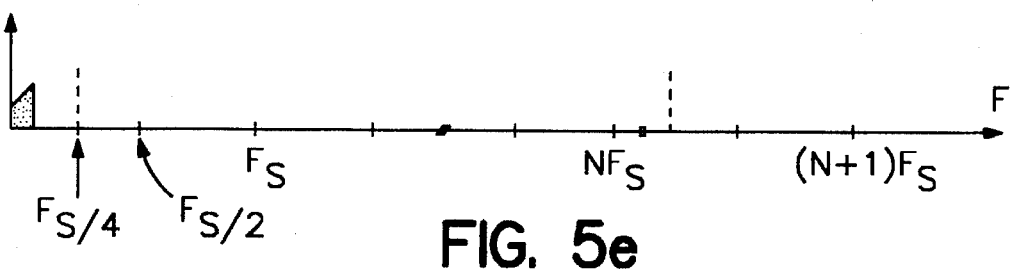

Reference is now made to FIG. 6 of the drawing, a block diagram of still another embodiment of an NMR receiver in accordance with the present invention. The receiver of FIG. 6 can incorporate the digital multipliers and digital oscillator of FIG. 2 or the Hilbert transformer of FIG. 4. The receiver of FIG. 6 differs from the receivers of FIGS. 2 and 4 because the receiver of FIG. 6 includes analog mixer 76 responsive to the output of coil 14 of probe 10 and to the output of analog local oscillator 78 that is synchronized by a reference time base as a master clock also controlling transmitter 12.

Mixer 76 derives an intermediate frequency output signal having a center frequency displaced from baseband and from the center frequency of the output of coil 14 of probe 10. The bandwidth of the intermediate frequency output of analog mixer 76 is equal to the bandwidth of the signal derived from coil 14. The intermediate frequency output of analog mixer 76 is applied to analog bandpass filter 80, having a center frequency equal to the center frequency of the output of mixer 76 and a bandpass equal to the bandwidth of the output signal of coil 14. The resulting, frequency translated analog output signal of bandpass filter 80 is supplied to a signal input terminal of analog to digital converter 82, having a sample input terminal responsive to pulses from local oscillator 84, synchronized by a reference time base on a master clock also controlling transmitter 12. Sampling signal 84 derives sampling pulses having a frequency that is at least 2B or 4B and less than the center frequency of the output of bandpass filter 80, having a bandpass of B. If the output of converter 82 is processed by a pair of parallel digital multipliers, as in the embodiment of FIG. 2, the output of sampling signal 84 has a frequency of at least 2B. Alternatively, sampling signal 84 derives pulses having a minimum frequency of 4B if the output of converter 82 is supplied to a Hilbert transformer, of the type employed in FIG. 4. The output of converter 82 has a high resolution, between 12 and 18 bits.

According to a further embodiment of the invention, the receiver of FIG. 2 is modified so digital multipliers 56 and 58 and digital oscillator 60 are eliminated and the analog input of analog to digital converter 52 is sampled in response to a non-uniform sampling waveform having an average frequency 2B, which is considerably less than the probe center frequency. The nonuniform sampling waveform can be considered as two sampling waves S1 and S2 for converter 52 that are time displaced so orthogonal samples of the analog input of the converter are derived.

Figure 7:
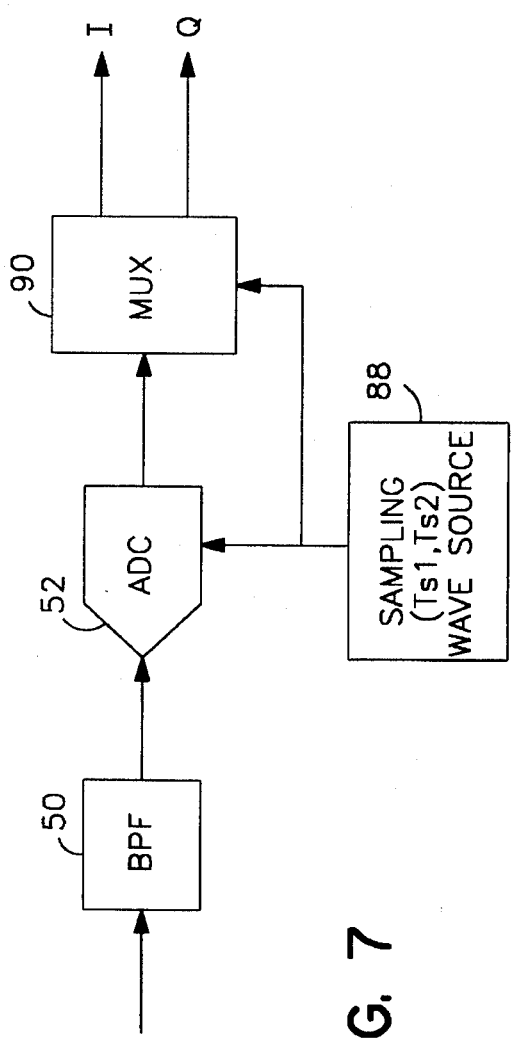
FIG. 7 is a partial block diagram of a fourth embodiment of a receiver including an analog to digital converter that is sampled twice at the same frequency and with different phases.

To these ends, the further embodiment of the invention is illustrated in FIG. 7 as including bandpass filter 50 and analog to digital converter 52, having the same characteristics as the corresponding elements of FIG. 2. Converter 52 samples the analog output of filter 50 in response to a nonuniform sampling waveform with sampling times $Ts_1$ and $Ts_2$. The nonuniform sampling waveforms with sampling times $Ts_1$ and $Ts_2$, derived from source 88, have an average frequency which is a submultiple of the center frequency of filter 50.

Figure 8:
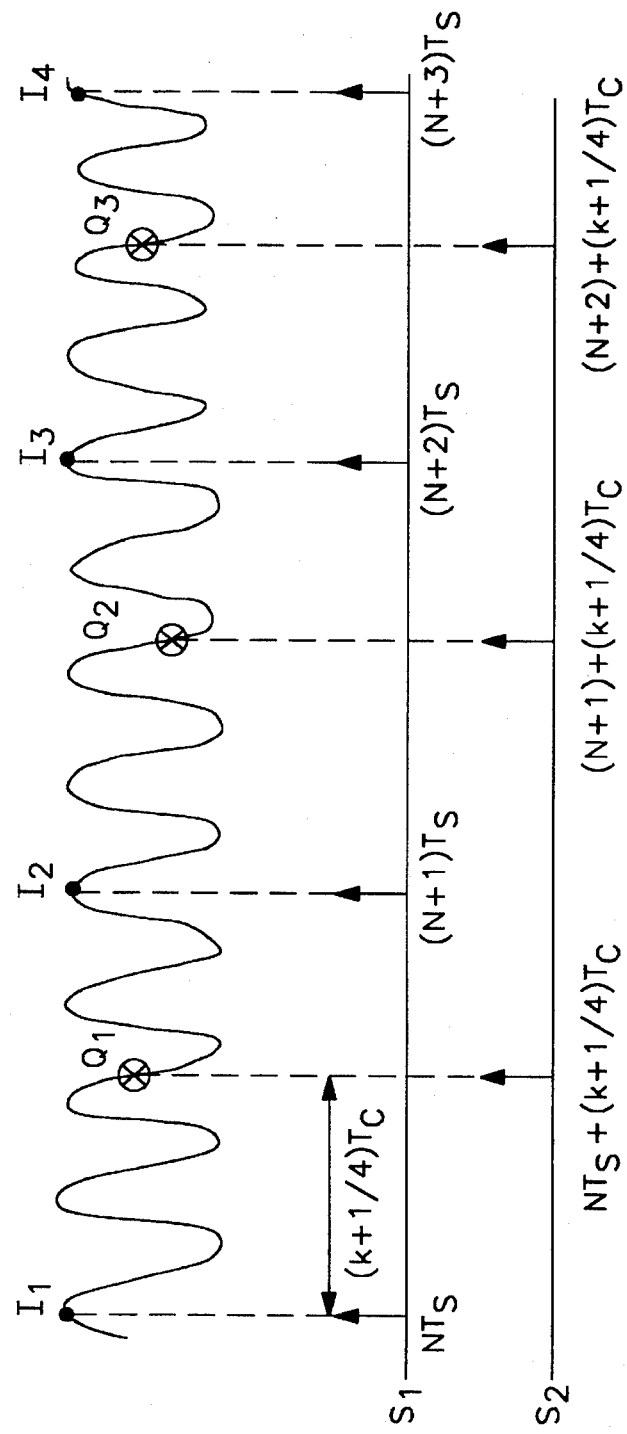
FIG. 8 shows waveforms useful in describing the operation of FIG. 7.

In one preferred embodiment, sampling pulses in wave s1 occur when the sinusoidal wave corresponding with the center frequency of filter 50 has a positive maximum value and the pulses in sampling wave s2 occur when the sinusoidal wave has a zero, negative going value, as illustrated in FIG. 8. As indicated in FIG. 8, the sampling pulses of sampling waves $s_1$ and $s_2$ occur during different cycles of the sinusoidal wave. The sampling pulses of sampling waves $s_1$ and $s_2$ respectively occur at times NTs and $(NTs+(k+1/4))Tc$ where the sampling time (for uniform sampling)$Ts'=Ts/2=$ $$\frac{1}{2Fs} = \frac{1}{4B}$$

and the period of the carrier frequency (Tc) at the center of the bandpass of filter 50 is ; for a typical example, Fc is about 600 mHz and B; the bandwidth of filter 50 is about 50 kHz. The different cycles are time displaced by a sufficient amount to enable converter 52 to operate at a relatively slow speed. This is necessary to enable converter 52 to be a relatively inexpensive device that need not handle the center frequency of filter 50. In the example of FIG. 8, k=2.

Alternate multi-bit outputs of converter 52 are respectively supplied by multiplexer 90 as I and Q inputs of high-speed decimating digital filters 62 and 64 in the same manner that the I and Q inputs are supplied to the corresponding filters of FIGS. 2, 4 and 6. To these ends, multiplexer 90 responds to the sampling pulses of the same sampling waves $s_1$ and $s_2$ which are supplied to converter 52. In response to a sampling pulse in wave $s_1$, multiplexer 90 responds to the outputs of converter 52 which are derived when the sinusoidal wave has a positive maximum voltage so the digital signal derived by converter 52 corresponding to the positive maximum voltage of the sinusoidal wave is supplied by the multiplexer to the I output thereof and to filter 62. In response to the sampling pulses of sampling wave $s_2$, multiplexer 90 is activated so the output of converter 52, a digital signal representing the sampled output of filter 50 when the sinusoidal wave has a zero voltage, is supplied by the multiplexer to the Q output of the multiplexer, thence to filter 64.

The arrangement of FIG. 7 is thus advantageous because it eliminates the need for the digital oscillator and digital multipliers of FIG. 2 and the Hilbert transformers of FIGS. 4 and 6. These somewhat complex and expensive components are replaced by an inexpensive and conventional multiplexer and by providing a delay circuit or phase shifter in source 88 for sampling pulses obtained from the sampling sources of FIGS. 2, 4 and 6. While there have been described and illustrated specific embodiments of the invention, it will be clear that variations in the details of the embodiments specifically illustrated and described may be made without departing from the true spirit and scope of the invention as defined in the appended claims.

We claim:

1. A nuclear magnetic resonance receiver responsive to an analog signal within a selected passband derived in response to an output of a nuclear magnetic resonance detecting probe, the signal having a center frequency and a bandwidth that is a small fraction of the center frequency, information about an analyte in the probe being contained in the signal in said passband, the receiver comprising an analog to digital converter for (i) sampling the analog signal at a frequency substantially less than the center frequency and that is at least twice the bandwidth of the signal and (ii) deriving a digital signal having values commensurate with the amplitude of the analog signal samples, a bandpass filter having a bandpass B connected to supply said signal to a signal input terminal of said converter, the converter sampling the signal with first and second waves each having a frequency of at least 2B, the first wave being at a first phase of a sinusoidal wave corresponding to the center frequency of the filter, the second wave being at a second phase of the sinusoidal wave, and digital processing means responsive to the digital signal derived by the converter for deriving another digital signal having a value determined by the information.

2. The receiver of claim 1 wherein the signal is derived from a coil of the probe, the signal at the center frequency derived from the coil being the analog signal sampled by the analog to digital converter.

3. The receiver of claim 2 wherein the sampling by the first wave is during a first cycle of the sinusoidal wave and the sampling by the second wave is during a second cycle of the sinusoidal wave.

4. The receiver of claim 3 wherein the first and second phases are orthogonal.

5. The receiver of claim 2 further including a bandpass filter having a bandpass B connected to supply the signal to a signal input terminal of the converter, the converter sampling the signal at a frequency of 4B.

6. The receiver of claim 1 wherein the probe includes a coil for deriving a signal that is a replica of the analog signal sampled by the analog to digital converter except that the signal derived by the coil has a center frequency translated from the center frequency of the analog signal sampled by the analog to digital converter, and means responsive to the signal derived by the coil for frequency translating the signal derived by the coil to the frequency of the analog signal sampled by the analog to digital converter and for supplying the frequency translated signal to the converter.

7. The receiver of claim 1 wherein the converter samples the signal at a frequency of 2NB, where N is an integer greater than zero.

8. The receiver of claim 1 wherein said first and second phases of the analog signal are different.

9. The receiver of claim 8 wherein the different phases are orthogonal.

10. The receiver of claim 8 wherein the processing means includes a multiplexer responsive to the converter.

11. A method of processing an analog signal derived in response to an output of a nuclear magnetic resonance detecting probe, the signal having a center frequency and a bandwidth that is a small fraction of the center frequency, information about an analyte in the probe being contained in the signal, the method comprising sampling the analog signal at a frequency substantially less than the center frequency and at a frequency that is at least twice the bandwidth of the signal, said sampling carried out twice at said frequency at different phases of said analog signal, deriving a multi-bit digital signal having values commensurate with the amplitude of the analog signal samples, and processing the digital signal resulting from the sampling to derive another digital signal having a value determined by the information.

12. The receiver of claim 11 wherein the different phases are orthogonal.

13. A nuclear magnetic resonance receiver having a selected passband, said receiver responsive to an analog signal derived in response to an output of a nuclear magnetic resonance detecting probe, the signal having a center frequency and a bandwidth that is a small fraction of the center frequency, information about an analyte in the probe being contained in the signal within said passband, the receiver comprising an analog to digital converter for (i) sampling the analog signal at a frequency that is substantially less than the center frequency and at least twice the bandwidth of the signal and (ii) deriving a digital signal having values commensurate with the amplitudes of the analog signal samples, and digital processing means responsive to the digital signal derived by the converter for deriving I and Q channel digital signals having values determined by the information, said processing means includes first and second digital multipliers driven in parallel by the digital signal derived by the converter and by digital representations of quadrature phased outputs of a local oscillator.

14. The receiver of claim 13 wherein the I and Q channel digital signals are derived at baseband.

15. The receiver of claim 13 wherein the analog signal sampled by the converter has the same center frequency as the center frequency derived from a detecting coil of the probe.

16. The receiver of claim 13 further including low pass filter means responsive to the I and Q channel digital signals derived by the digital multipliers.

17. The receiver of claim 16 wherein the low pass filter means includes a decimating digital filter.

18. The receiver of claim 17 wherein the low pass filter means includes a low pass digital filter responsive to the decimating digital filter.

19. The receiver of claim 13 wherein the signal is supplied to a signal input terminal of the converter via a bandpass filter having a bandpass frequency B and the converter samples the signal at frequency 2B.

20. The receiver of claim 13 wherein the processing means includes a digital transformer arrangement for processing the digital values derived by the converter at times k, (k+2), (k+4) etc. into the I channel digital signals and the digital values derived by the converter at times (k+1), (k+3), (k+5) etc. into the Q channel digital signals.

21. The receiver of claim 20 further including low pass filter means responsive to the I and Q channel digital signals derived by the transformer arrangement.

22. The receiver of claim 21 wherein the low pass filter means includes a decimating digital filter.

23. The receiver of claim 22 wherein the low pass filter means includes a low pass digital filter responsive to the decimating digital filter.

24. The receiver of claim 20 wherein the signal is supplied to a signal input terminal of the converter via a bandpass filter having a bandpass frequency B and the converter samples the signal at frequency 4B.

25. The receiver of claim 13 wherein the analog signal sampled by the converter is at an intermediate frequency that is less than the frequency derived from a detecting coil of the probe and greater than baseband.

26. The receiver of claim 24 further including an analog mixer responsive to a local oscillator and a signal having the same center frequency as the center frequency derived from a detecting coil of the probe, the local oscillator deriving the intermediate frequency sampled by the converter.

27. The receiver of claim 13 further including digital low pass filter means responsive to the I and Q channel digital signals.

28. The receiver of claim 26 wherein the low pass filter means includes a decimating digital filter.

29. The receiver of claim 27 wherein the low pass filter means includes a low pass digital filter responsive to the decimating digital filter.

30. The receiver of claim 13 wherein the converter samples the analog signal twice at the frequency that is substantially less than the center frequency and at different phases of the analog signal.

31. The receiver of claim 30 wherein the different phases are orthogonal.

32. The receiver of claim 30 wherein the processing means includes a multiplexer responsive to the converter for deriving the I and Q channel digital signals.

33. A nuclear magnetic resonance system comprising a detecting probe for an analyte to be monitored; a transmitter for energizing the detecting probe, the probe and the analyte responding to energization thereof by the transmitter for deriving an analog signal having a center frequency and a bandwidth that is a small fraction of the center frequency, information about the analyte being contained in the signal; a receiver responsive to the analog signal and the excitation source; the receiver including an analog to digital converter for (i) sampling the analog signal at a frequency substantially less than the center frequency and at least twice the bandwidth of the signal, said sampling carried out twice at said frequency at different phases of said analog signal, and (ii) deriving a digital signal having values commensurate with the amplitude of the analog signal samples; a digital computer responsive to the digital signal derived by the converter for deriving another digital signal having a value determined by the information; and output means responsive to the another digital signal.

34. A method of processing an analog signal derived in response to an output of a nuclear magnetic resonance detecting probe, the signal having a center frequency and a bandwidth that is a small fraction of the center frequency, information about an analyte in the probe being contained in the signal in the bandwidth, the method comprising sampling the analog signal at a frequency substantially less than the center frequency and at least twice the bandwidth of the signal, said sampling step carried out twice at said frequency at different phases of said analog signal, deriving a digital signal having values commensurate with the amplitudes of the analog signal samples, and processing the digital signal resulting from the sampling to derive I and Q channel digital signals having values determined by the information.

* * * * *